United States Patent

Sakagawa et al.

(10) Patent No.: US 7,417,445 B2
(45) Date of Patent: Aug. 26, 2008

(54) PROBING METHOD AND PROBER FOR MEASURING ELECTRICAL CHARACTERISTICS OF CIRCUIT DEVICES

(75) Inventors: Hideo Sakagawa, Nirasaki (JP); Takashi Watanabe, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/070,369

(22) Filed: Mar. 3, 2005

(65) Prior Publication Data

US 2005/0168232 A1 Aug. 4, 2005

Related U.S. Application Data

(60) Division of application No. 10/662,512, filed on Sep. 16, 2003, now Pat. No. 6,906,542, which is a continuation of application No. PCT/JP02/02371, filed on Mar. 13, 2002.

(30) Foreign Application Priority Data

Mar. 16, 2001 (JP) ............................ 2001-077077

(51) Int. Cl.
*G01R 31/02* (2006.01)
(52) U.S. Cl. ...................... 324/754; 324/758
(58) Field of Classification Search .......... 324/754–765
See application file for complete search history.

(56) References Cited

U.S. PATENT DOCUMENTS

| 4,677,474 | A | 6/1987 | Sato et al. |
| 4,786,867 | A | 11/1988 | Yamatsu |
| 5,644,245 | A * | 7/1997 | Saitoh et al. ................ 324/754 |
| 5,828,225 | A * | 10/1998 | Obikane et al. ............ 324/758 |
| 5,936,416 | A | 8/1999 | Tanaka et al. |
| 5,999,268 | A * | 12/1999 | Yonezawa et al. ........... 356/399 |
| 6,140,828 | A | 10/2000 | Iino et al. |
| 6,777,968 | B1 * | 8/2004 | Kobayashi et al. ......... 324/758 |

FOREIGN PATENT DOCUMENTS

| JP | 1-227449 | 9/1989 |
| JP | 7-29741 | 11/1995 |
| JP | 8-213436 | 8/1996 |

* cited by examiner

*Primary Examiner*—Vinh P Nguyen
(74) *Attorney, Agent, or Firm*—Oblon, Spivak, McClelland, Maier & Neustadt, P.C.

(57) ABSTRACT

A prober for measuring the electrical characteristics of a test target object includes a tester, stage, probe card, first sensor, second sensor, and controller. The stage places a test target object thereon. The test target object has a plurality of electrical circuit devices on its surface. Each of the electrical circuit devices has a plurality of electrodes on its surface. The probe card is arranged above the stage. The probe has a plurality of probes. The probes are connected to the tester. The first sensor detects the positions of distal ends of the probes. The second sensor detects the surface position of an individual one of the electrical circuit devices. The controller brings the probes of the probe card and the electrodes of the electrical circuit devices into contact with each other.

16 Claims, 7 Drawing Sheets

PROBING METHOD AND PROBER FOR MEASURING ELECTRICAL CHARACTERISTICS OF CIRCUIT DEVICES

CROSS-REFERENCE TO RELATED APPLICATIONS

This application is a Divisional Application of application Ser. No. 10/662,512, filed on Sep. 16, 2003, now U.S. Pat. No. 6,906,542, which is a Continuation Application of PCT Application No. PCT/JP02/02371, filed Mar. 13, 2002, which was not published under PCT Article 21(2) in English, and both of which are hereby incorporated by reference in there entirety.

This application is based upon and claims the benefit of priority from the prior Japanese Patent Application No. 2001-077077, filed Mar. 16, 2001, the entire contents of which are incorporated herein by reference.

BACKGROUND OF THE INVENTION

1. Field of the Invention

The present invention relates to a probing method and prober for testing the electrical characteristics of an electrical circuit device. More specifically, the present invention relates to a probing method and prober which can detect the positions of the surfaces of the electrodes of an individual electrical circuit device formed on a test target object (e.g., a wafer W).

2. Description of the Related Art

FIGS. 9A and 9B show an example of a prober for integrated circuits formed on a semiconductor wafer A prober 10 has a loader chamber 1 from which a wafer W is to be transported, and a prober chamber 2 for testing the electrical characteristics of the wafer W transported from the loader chamber 1. The loader chamber 1 has a cassette support portion 3 where a cassette C for storing the wafer W is placed, a transfer mechanism (fork) 4 for transporting the wafer W to the loader chamber 1, and a subchuck 5 for prealigning the wafer W on the way when the fork 4 transports the wafer W. The prober chamber 2 has a wafer stage (to be referred to as "main chuck" hereinafter) 6, a mechanism for aligning the wafer W on the main chuck 6 (to be referred to as "alignment mechanism" hereinafter) 7, and a probe card 8. The pre-aligned wafer W is placed on the main chuck 6 with the fork 4. The main chuck 6 can move in the X, Y, Z, and θ directions. The electrodes of a plurality of integrated circuits formed on the wafer W placed on the main chuck 6 are aligned with the probes of the probe card by the alignment mechanism 7 and the movement of the main chuck 6. The probe card 8 is fixed to a head plate 2A which forms the upper surface of the prober chamber 2.

As shown in FIGS. 9A and 9B, the alignment mechanism 7 includes a lower CCD camera 7A and upper CCD camera 7B. The two cameras are driven under the control of a control unit. The lower CCD camera 7A is provided to the main chuck 6. The lower CCD camera 7A senses probes 8A of the probe card 8 from lower side. The upper CCD camera 7B formed at the center of an alignment bridge 7C senses the wafer W on the main chuck 6 from upper side. The sensed images of probe 8A and wafer W are displayed on a monitor screen 9A of a display unit 9. The alignment bridge 7C moves in the upper portion of the prober chamber 2 and along guide rails 7D running in the Y direction from rear end (upper portion in FIG. 9B) of the prober chamber 2 to the probe center. The main chuck 6 has a target 7E which can move forward and backward to above the lower CCD camera 7A. The heights of the needle points of the probes 8A are obtained by sensing the needle points with the lower CCD camera 7A. The optical axes of the lower and upper CCD cameras 7A and 7B are set to coincide with each other through the target 7E. The level of the main chuck 6 at this moment is used as a reference level when performing alignment of the wafer W and probes 8A.

A test head T is rotatably provided to the prober chamber 2. The test head T is electrically connected to the probe card 8 through an interface (not shown). A signal from a tester is transmitted to the electrode pads of the wafer through the test head T and probes 8A. The electrical characteristics of the plurality of integrated circuits (chips) formed on the wafer W are measured from this signal.

To bring the wafer W and probes 8A into contact with each other with a predetermined pressure, the surface height of the wafer W is detected. For this detection, four portions of the wafer W equiangularly distant from each other in the circumferential direction, and the center of the wafer W, i.e., five portions, are sensed by the upper CCD camera 7B while the main chuck 6 is moved in the X and Y directions. The level in the Z direction of the main chuck 6 at each sensed position is obtained as the surface height of the wafer W. The average value of the obtained heights is calculated, thus detecting the surface height of the wafer W.

Conventionally, the heights of the positions of a plurality of portions on the wafer W are detected by focusing the upper CCD camera 7B on the surface of the wafer W. In this detection process, the main chuck 6 is vertically moved toward the focal point of the upper CCD camera 7B, so that the upper CCD camera 7B is focused on the surface of the wafer W. Due to this complicated operation, focusing takes time. As the surface of the wafer W has steps, the average value of the heights of the plurality of points on the surface of the wafer W does not necessarily coincide with the surface height of the individual chip formed on the wafer W. Consequently, each probe comes into contact with different chips with different needle pressures.

BRIEF SUMMARY OF THE INVENTION

It is an object of the present invention to solve one or a plurality of problems of the prior art.

According to an embodiment of the present invention, the surface height of each of a plurality of electronic circuit devices formed on a test target object such as a wafer can be detected quickly. Consequently, according to the embodiment of the present invention, there is provided a probing method and prober that can improve the throughput.

Alternatively, according to an embodiment of the present invention, there is provided a probing method and prober that perform highly reliable test under a stable needle pressure.

According to the first aspect of the invention of the present application, there is provided a prober for measuring electrical characteristics of a test target object W, the prober comprising:

a stage which places a test target object thereon, the test target object having a plurality of electrical circuit devices on a surface thereof, each of the electrical circuit devices having a plurality of electrodes on a surface thereof;

a probe card which is arranged above the stage, the probe card comprising a plurality of probes;

a first sensor which detects positions of distal ends of the probes;

a second sensor which detects a surface position of an individual one of the electrical circuit devices; and a controller which brings the probes of the probe card and the electrodes of the electrical circuit devices into contact with each other on the basis of the positions of the distal ends of the probes detected by the first sensor and the surface position of each of the electrical circuit devices detected by the second sensor, the controller sequentially performing the contact for each of the plurality of electrical circuit devices.

According to the second aspect of the invention of the present application, there is provided a prober for measuring electrical characteristics of a test target object, the prober comprising:

a stage which places a test target object W thereon, the test target object having a plurality of electrical circuit devices on a surface thereof, each of the electrical circuit devices having a plurality of electrodes on a surface thereof;

a probe card which is arranged above the stage, the probe card comprising a plurality of probes;

a first sensor which comprises a load sensor, the load sensor detecting whether distal ends of the probes are in contact with a surface of the load sensor;

a second sensor which detects an average position of a surface of the test target object, and a controller which brings the probes of the probe card and the electrodes of the electrical circuit devices into contact with each other on the basis of the positions of the distal ends of the probes detected by the first sensor and the positions of surfaces of the electrodes of each of the electrical circuit devices detected by the second sensor, the controller sequentially performing the contact for each of the plurality of electrical circuit devices.

According to the third aspect of the invention of the present application, there is provided a prober for measuring electrical characteristics of a test target object, comprising:

measurement means for measuring electrical characteristics of a plurality of electronic circuit devices formed on the test target object;

support means for placing the test target object thereon, the test target object having a plurality of electrical circuit devices on a surface thereof, each of the electrical circuit devices having a plurality of electrodes on a surface thereof;

a probe card which comprises a plurality of probes that are connected to the measurement means;

first detection means for detecting positions of distal ends of the probes;

second detection means for detecting a surface position of an individual one of the electrical circuit devices; and control means for bringing the probes of the probe card and the electrodes of the electrical circuit devices into contact with each other on the basis of the positions of the distal ends of the probes detected by the first sensor and the surface position of each of the electrical circuit devices detected by the second sensor, the control means sequentially performing the contact for each of the plurality of electrical circuit devices.

According to the fourth aspect of the invention of the present application, there is provided a probing method of testing electrical characteristics of a plurality of electronic circuit devices formed on a test target object W placed on a stage by using a prober having a probe, the probing method comprising:

(a) detecting a position of at least one probe with a first image sensing mechanism;

(b) causing a focal point of the first image sensing mechanism and a focal point of a second image sensing mechanism to coincide with each other, to detect positions of surfaces of the electronic circuit devices;

(c) detecting a level of a surface of the stage;

(d) placing the test target object on the stage;

(e) aligning the probe and surfaces of electrodes of the electronic circuit devices formed on the test target object, the step comprising;

(e1) irradiating at least one predetermined region of the electronic circuit devices with light;

(e2) extracting reflected light from the predetermined region into a focal point detection optical system;

(e3) pupil-splitting the reflected light into first and second light in the focal point detection optical system;

(e4) obtaining defocus amounts of the surfaces of the electronic circuit devices on the basis of light quantity distributions of the first and second light; and (e5) moving the stage on the basis of the defocus amounts, thereby causing the focal point of the second image sensing mechanism and the surfaces of the electrodes of the test target object to coincide with each other, and (f) bringing the probes and the electrodes of the test target object into contact with each other.

According to the fifth aspect, there is provided a method of measuring electrical characteristics of a plurality of electronic circuit devices formed on a test target object by using a prober, the method comprising:

(a) detecting a position of at least one probe among a plurality of probes provided to a probe card;

(b) causing a focal point of a first image sensing mechanism and a focal point of a second image sensing mechanism to coincide with each other, to detect positions of surfaces of the electronic circuit devices;

(c) detecting a position of a surface of each of the electrical circuit devices formed on a surface of the test target object placed on a stage;

(d) placing the test target object on the stage, each of the plurality of electrical circuit devices formed on the test target object comprising a plurality of electrodes on a surface thereof; and (e) bringing the plurality of probes and a predetermined electrode of one of the electrical circuit devices into contact with each other on the basis of the detected position of the probe and positions of the electrodes.

According to the sixth aspect of the invention of the present application, there is provided a method of measuring electrical characteristics of a plurality of electronic circuit devices formed on a test target object by using a prober, the method comprising:

(a) detecting a position of at least one probe among a plurality of probes provided to a probe card;

(b) causing a focal point of a first image sensing mechanism and a focal point of a second image sensing mechanism to detect positions of surfaces of the electronic circuit devices to coincide with each other;

(c) detecting a position of a surface of each of the electrical circuit devices formed on a surface of the test target object placed on a stage;

(d) placing the test target object on the stage, each of the plurality of electrical circuit devices formed on the test target object comprising a plurality of electrodes on a surface thereof; and (e) bringing the plurality of probes and a predetermined electrode of one of the electrical circuit devices into contact with each other on the basis of the detected position of the probe and the positions of the surfaces of the electrical circuit devices.

BRIEF DESCRIPTION OF THE SEVERAL VIEWS OF THE DRAWING

FIGS. 9A and 9B are views showing a conventional prober, in which FIG. 9A is a sectional front view, and FIG. 9B is a plan view schematically showing the interior of FIG. 9A.

DETAILED DESCRIPTION OF THE INVENTION

The present invention relates to a probing method and prober aimed at various types of electronic circuit devices, e.g., integrated circuit formed on a semiconductor wafer or electronic circuits for liquid crystal display. To describe the present invention more specifically, in the following description, an embodiment of the present invention will be described with reference to a case in which the present invention is applied to a probing method and prober for measuring the electrical characteristics of a plurality of integrated circuits (chips) formed on the semiconductor wafer.

Figure 1A:
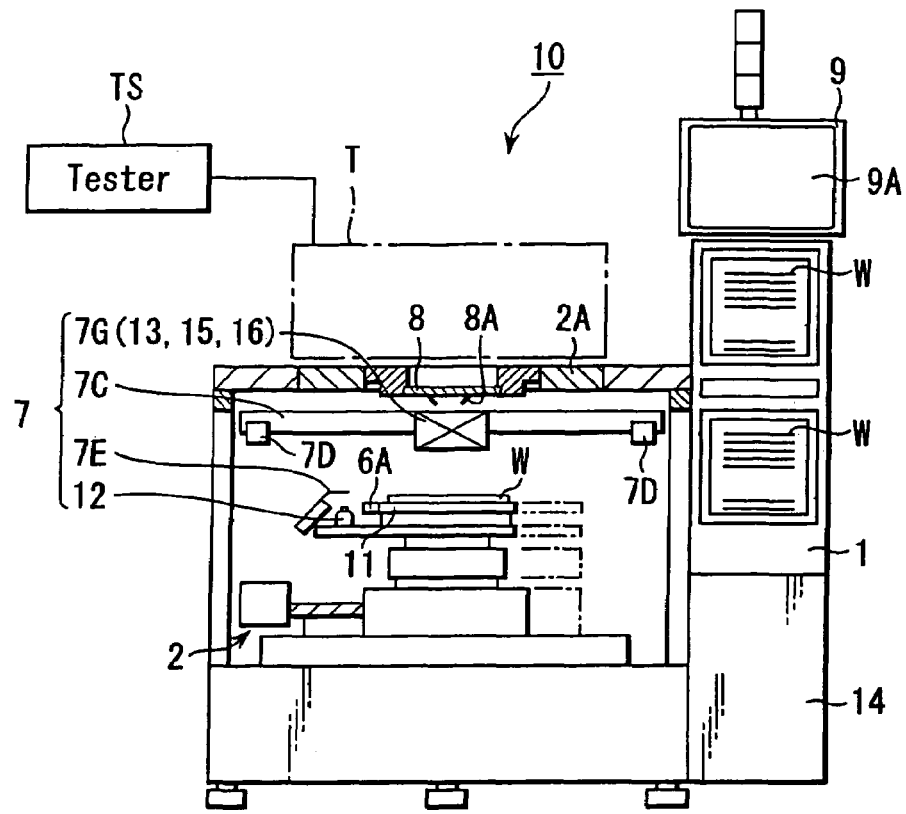
FIGS. 1A and 1B are views showing a prober according to an embodiment of the present invention.
Figure 1B:
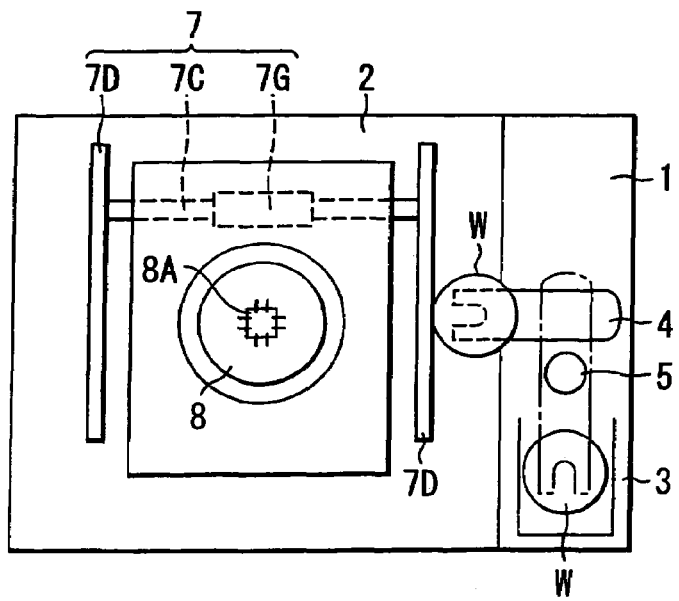

FIGS. 1 to 8 show the embodiment of the present invention. The prober according to the embodiment of the present invention is formed in the same manner as the conventional prober except for the respects to be described hereinafter. Hence, this embodiment will be described mainly regarding the characteristic portions of the prober. As shown in FIG. 1, a prober 10 according to this embodiment has a first sensor (image sensing mechanism) 12 for sensing probes 8A, a second sensor (image sensing mechanism) 7G for sensing a test target object (e.g., a wafer) W on a main chuck 11, and a controller 14 for driving the main chuck 11 on the basis of information from the first image sensing mechanism 12 and second image sensing mechanism 7G. The first image sensing mechanism 12 can be attached to a stage (main chuck) 11 that can move in the X, Y, Z, and θ directions. The second image sensing mechanism 7G can be movably provided above the main chuck 11.

While the electrodes of a plurality of integrated circuits (chips) formed on the wafer W and the probes are in contact with each other under the control of the controller 14, a tester TS measures the electrical characteristics of the individual chips formed on the wafer W through a test head T and probe card 8.

Figure 2:
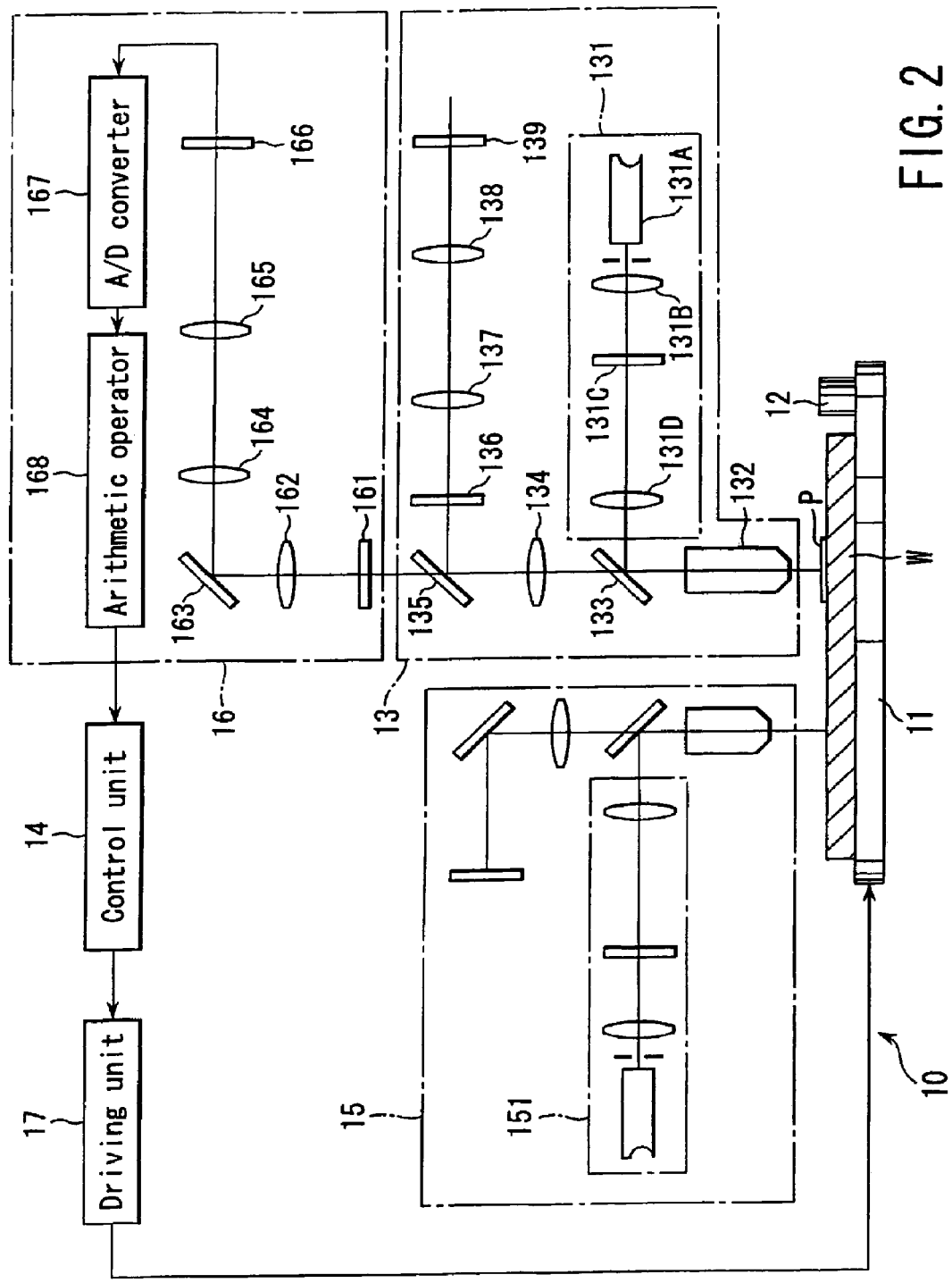
FIG. 2 is a view showing the arrangement of the main part of the prober according to the embodiment of the present invention.

As shown in FIG. 2, the prober 10 further has a third image sensing mechanism 15. When detecting the surface heights of the plurality of chips formed on the wafer W, the third image sensing mechanism 15 senses the entire image of the wafer W. The second image sensing mechanism 7G senses part of the wafer W in enlargement. The second and third image sensing mechanisms 7G and 15 have light-irradiating mechanisms 131 and 151, respectively. The surface of the main chuck 11 is sensed with light from the light-irradiating mechanisms 131 and 151. Namely, a second image sensing mechanism 13 senses the surface of the wafer W in a micro-visual field, and the third image sensing mechanism 15 senses the surface of the wafer W in a macro-visual field.

As shown in FIG. 1, the second image sensing mechanism 13 has an objective lens 132, first half mirror 133, second objective lens 134, second half mirror 135, first visual field limiting member 136, relay lenses 137 and 138, and CCD 139. The light-irradiating means 131 has a light source 131A such as a halogen lamp, condenser lens 131B, second visual field limiting member 131C, and relay lens 131D. When the second image sensing mechanism 13 is to sense the surface of the wafer W, irradiation light from the light source 131A of the light-irradiating means 131 is focused by the condenser lens 131B, passes through the second visual field limiting member 131C and relay lens 131D, is reflected toward the wafer W by the first half mirror 133, passes through the objective lens 132, and irradiates the surface of the wafer W on the main chuck 11. During this process, the irradiation light illuminates that region on the wafer W which is limited by the first visual field limiting member 131C. The reflected light from the wafer W passes through the objective lens 132, first half mirror 133, and second objective lens 134, is reflected by the second half mirror 135, passes through the third visual field limiting member 136 and relay lenses 137 and 138, and reaches the CCD 139.

Figure 3A:
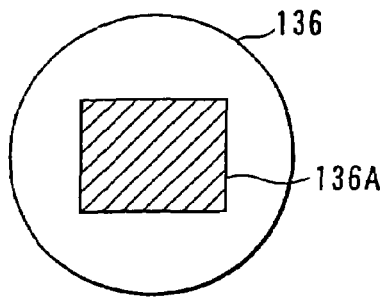
FIGS. 3A to 3C are front views showing the first and second view field limiting members shown in FIG. 2.
Figure 3B:
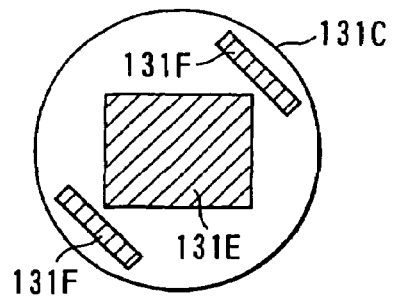
Figure 4:
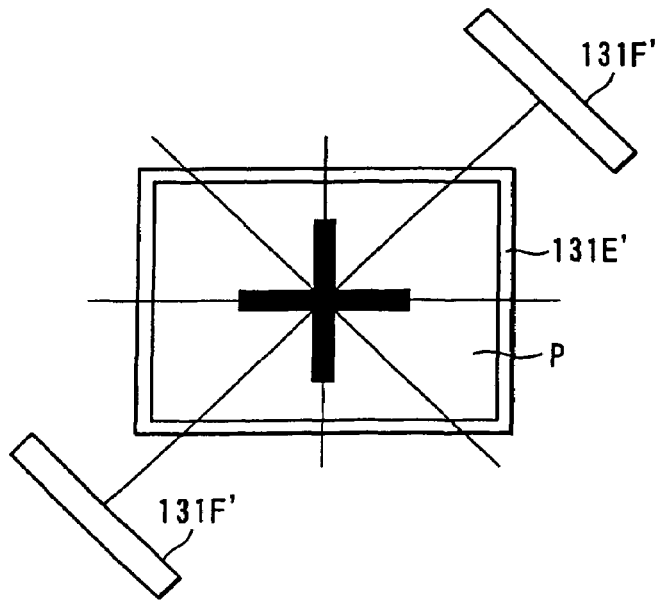
FIG. 4 is an enlarged plan view showing a region irradiated by the light-irradiating means of a second sensing mechanism.

As shown in, e.g., FIG. 3A, an aperture 136A can be formed at the center of the third visual field limiting member 136. For example, the aperture 136A can have such a size that it can transmit only reflected light from a region slightly larger than one electrode pad P of the chips formed on the wafer W. As shown in FIG. 3B, a first aperture 131E corresponding to the aperture 136A of the third visual field limiting member 136 can be formed at the center of the first visual field limiting member 131C. Furthermore, a pair of second apertures 131F can be formed on the first visual field limiting member 131C to sandwich the first aperture 131E between them. As shown in FIG. 4, irradiation light from the light-irradiating means 131 forms a rectangular image 131E' corresponding to the first aperture of the second visual field limiting member 131C and rectangular images 131F' corresponding to the second apertures 131F on the surface of the wafer W. The reflected light is further limited by the third visual field limiting member 136 of the second image sensing mechanism 13, so that the image of only the electrode pad P is sensed by the CCD 139.

Figure 3C:
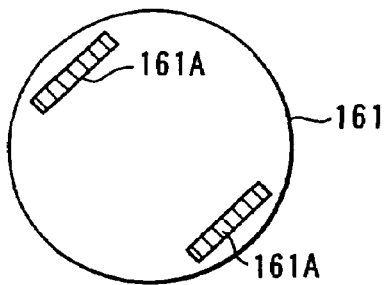

The prober 10 comprises a focal point detection unit 16 for auto-focusing the second image sensing mechanism 13. As shown in FIG. 2, the reflected light from the surface of the wafer W becomes incident on the focal point detection unit 16 by the second half mirror 135 of the second image sensing mechanism 13. On the basis of this reflected light, the focal point detection unit 16 detects the deviation amount (defocus amount) of the surface of the wafer W from the focal point of the second image sensing mechanism 13. As shown in FIG. 2, the focal point detection unit 16 can have a second visual field limiting member 161, relay lens 162, pupil splitting mirror 163, relay lenses 164 and 165, and photosensor 166. The reflected light from the wafer W is split into two beams by pupil splitting. The defocus amount is detected based on the images of the light split into two beams. As shown in FIG. 3C, the second visual field limiting member 161 has apertures 161A corresponding to the second apertures 131F of the first visual field limiting member 131C. The reflected light from the wafer W forms a predetermined pattern through the apertures 161A of the second visual field limiting member 161. The patterned reflected light passes through the relay lens 162 and is split into two beams through the pupil splitting mirror 163. The photosensor 166 detects two pairs of light quantity distributions corresponding to the two split reflected lights. The distance between the light quantity distributions of each pair (e.g., distance between barycenters, distance between peaks) detected by the photosensor 166 changes in accordance with the distance between the surface of the wafer W and the objective lens 132. The distance between the light quantity distributions of each pair detected by the photosensor 166 is subjected to arithmetic operation, so that the defocus amount can be detected. More specifically, the focal point detection unit 16 pupil-splits the reflected light from the thin elongated rectangular regions 131F' (see FIG. 3) at two portions outside the sensing region of the second image sensing mechanism 13. Thus, the defocus amount of the surface of the wafer W from the focal point of the second image sensing mechanism 13 can be detected automatically.

Figure 5C:
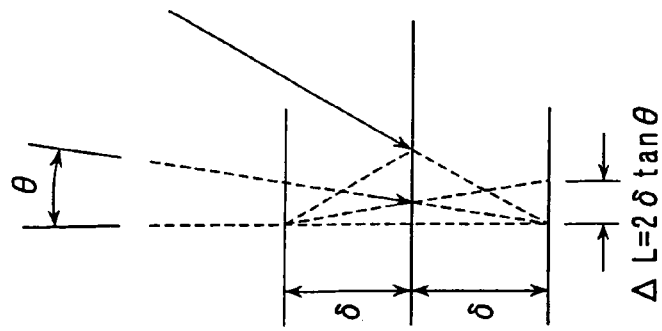
FIGS. 5A to 5C are views for explaining the principle of auto focus by pupil splitting.
Figure 5B:
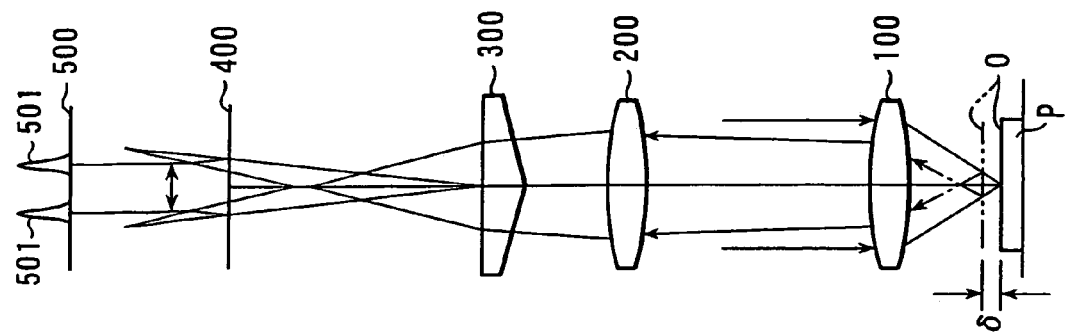
Figure 5A:
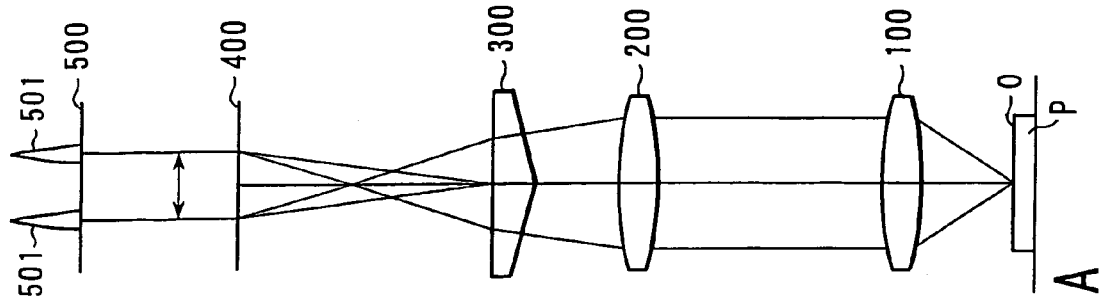

As shown in FIG. 5A, the reflected light from the surface passes through an objective lens 100 and relay lens 200, and is split into two beams with a pupil splitting prism 300, to form two images on a CCD 400. When the surface of an object O and the focal point of the objective lens 100 coincide (in-focus state), two light quantity distributions 501 separate from each other by a predetermined distance (e.g., distance between barycenters, distance between peaks) are formed in a photosensor 500. The relationship between the surface of the object O and the CCD is conjugate with that between the objective lenses 100 and 200. As shown in FIG. 5B, if the surface of the object O is shifted forward from the focal point of the objective lens 100 by a distance δ, the images obtained by pupil splitting of the pupil splitting prism 300 form behind the CCD 400. In comparison to the case of FIG. 5A, the distance between the two light quantity distributions obtained by the photosensor 500 decreases. This smaller distance (defocus amount) ΔL satisfies ΔL=2 δ tan θ, as shown in FIG. 5C. Conversely, when the surface of the object O is shifted backward from the focal point of the objective lens 100 by the distance δ, although not shown, the images obtained by pupil splitting of the pupil splitting prism 300 form in front of the CCD 400. Consequently, the distance between the two light quantity distributions in the photosensor 500 increases. This larger defocus amount ΔL satisfies ΔL=–δ tan θ, although not shown. Therefore, whether the surface of the wafer W is at the focal point of the objective lens 100, is shifted forward from it, or is shifted backward from it can be detected from the distance between the pair of light quantity distributions, together with the defocus amount. In addition, the defocus amount from the focal point of the object O can be automatically calculated on the basis of the characteristics of the optical components of the focal point detection unit and the distance between the light quantity distributions after pupil splitting.

Figure 6:
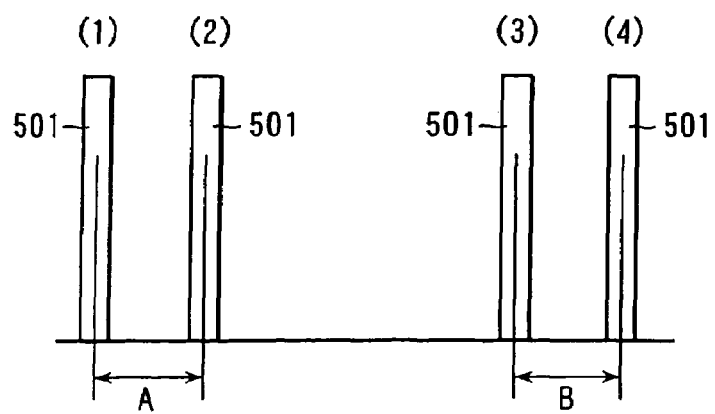
FIG. 6 is a view for explaining the light quantity distributions of pupil splitting detected by the photosensor of the focal point detection unit shown in FIG. 2.

In this embodiment, the reflected lights of light (131F' in FIG. 4) irradiating the two portions outside the electrode pad P on the wafer W pass through the apertures 161A of the second visual field limiting member 161, are split into two beams with the pupil splitting mirror 163, and reach the photosensor 166. Consequently, two pairs of light quantity distributions ①-④ are formed on the photosensor 166, as shown in FIG. 6. Alternatively, the light quantity distributions can be a pair of light quantity distributions. The photosensor 166 photoelectrically converts the detected signals. The photoelectrically converted signals are input to an arithmetic operator 168 through an A/D converter 167. The arithmetic operator 168 calculates the distances between the two pairs of light quantity distributions (e.g., distances between barycenters, distances between peaks) shown in FIG. 5 on the basis of the input signals. The average value of the two pairs of light quantity distributions is obtained on the basis of the arithmetic values. The defocus amount between the surface of the electrode pad P and the focal position of the second image sensing mechanism 13 is obtained on the basis of this average value. The defocus amount is output to the control unit 14. The control unit 14 drives a driving unit 17 on the basis of the arithmetic values from the arithmetic operator 168. The driving unit 17 moves the main chuck 11 by an amount corresponding to the defocus amount. As a result, the surface of the electrode pad P is leveled at the focal point of the second image sensing mechanism 13. The surface height of the electrode pad P at this time can be stored in the storage of the control unit 14. After that, the second image sensing mechanism 13 image-processes the detected signals of the CCD 139. Thus, a sensed image can be displayed on the screen of the display unit 9 (FIG. 1). With this series of operations, the surface height of the electrode pad P on the main chuck 11 is automatically detected and stored. After that, with the probe being in contact with the electrode pad P, the electrical characteristics of the chips formed on the wafer W are measured.

Figure 7:
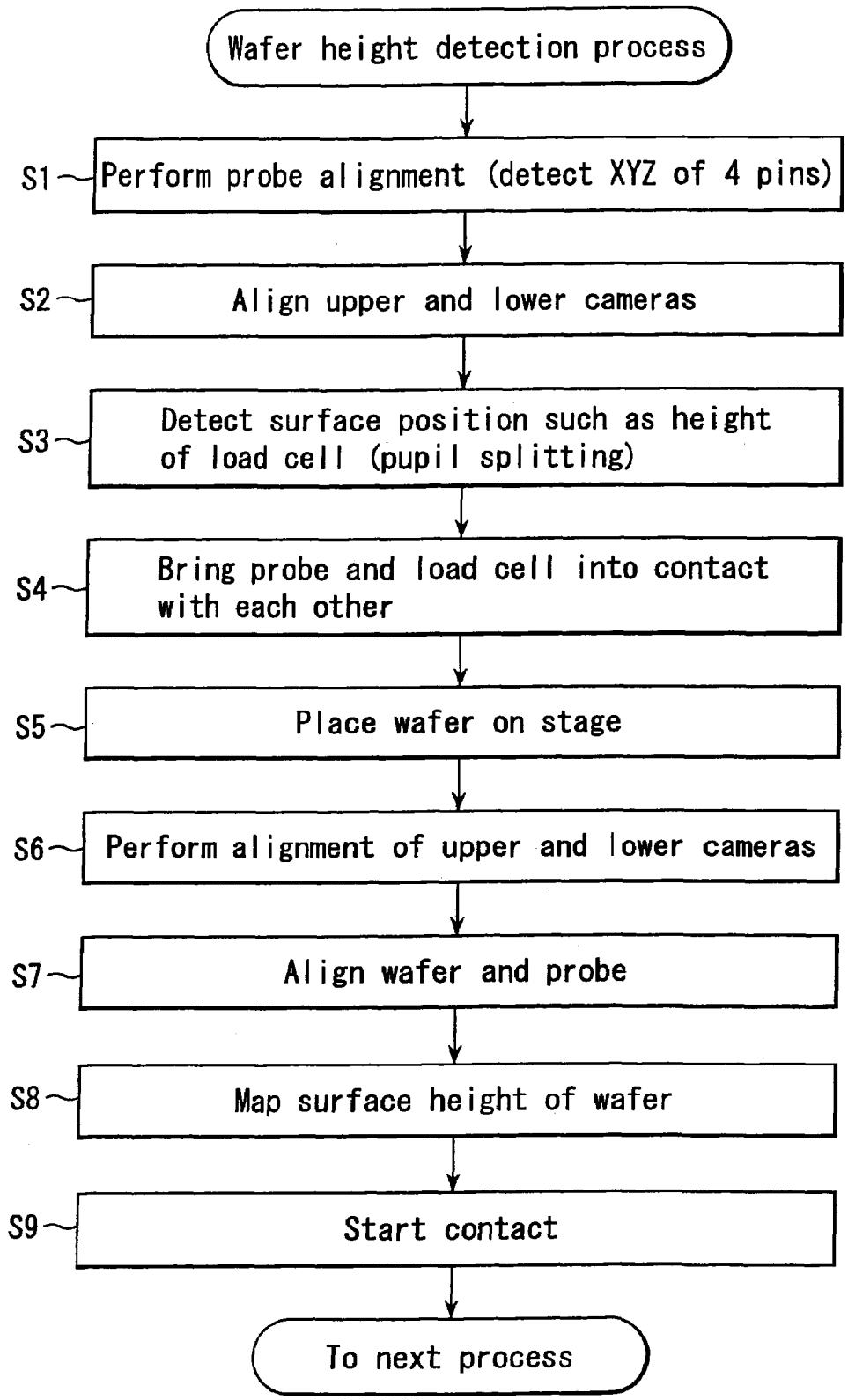
FIG. 7 is a flow chart showing a probing method according to an embodiment of the present invention.

A probing method according to this embodiment will be described with reference to FIGS. 7 and 8.

The main chuck 11 is driven by the driving unit 17 under the control of the control unit 14. When the first image sensing mechanism 12 senses predetermined four probes 8A (FIG. 1), the X, Y, and Z positions of the respective probes are detected (step S1). The first image sensing mechanism (lower camera) 12 and second image sensing mechanism (upper camera) 13 are aligned (step S2). The height of the surface of the main chuck 11 or of a load sensor (load cell) 6A provided to the main chuck 11 is detected by the auto focus scheme using pupil splitting described above (step S3). The main chuck 11 moves upward, and the distal ends of the probes come into contact with the load cell (step S4). By step S4, the amount by which the main chuck 11 should move upward during test is detected. The wafer W is placed (loaded) on the main chuck 11 (step S5). The upper and lower cameras 12 and 13 are aligned again (step S6).

After that, the alignment mechanism 7 (FIG. 1) aligns the probes and the wafer W (step S7). The heights of the surfaces of the plurality of chips formed on the wafer W are mapped in the memory (step S8). The main chuck 11 is moved upward, so the probes are brought into electrical contact with the electrode pads of the chips formed on the wafer W (step S9). In this state, the electrical characteristics of the respective chips on the wafer W are sequentially measured.

In step S8, mapping of the surface heights of the electrodes of the plurality of chips formed on the wafer W can be performed for all or some of the chips by utilizing the auto focus scheme employing pupil splitting described above. This mapping can be performed with the procedure shown in FIG. 8. The above steps S1 to S8 can be performed by appropriately changing their order.

Figure 8:
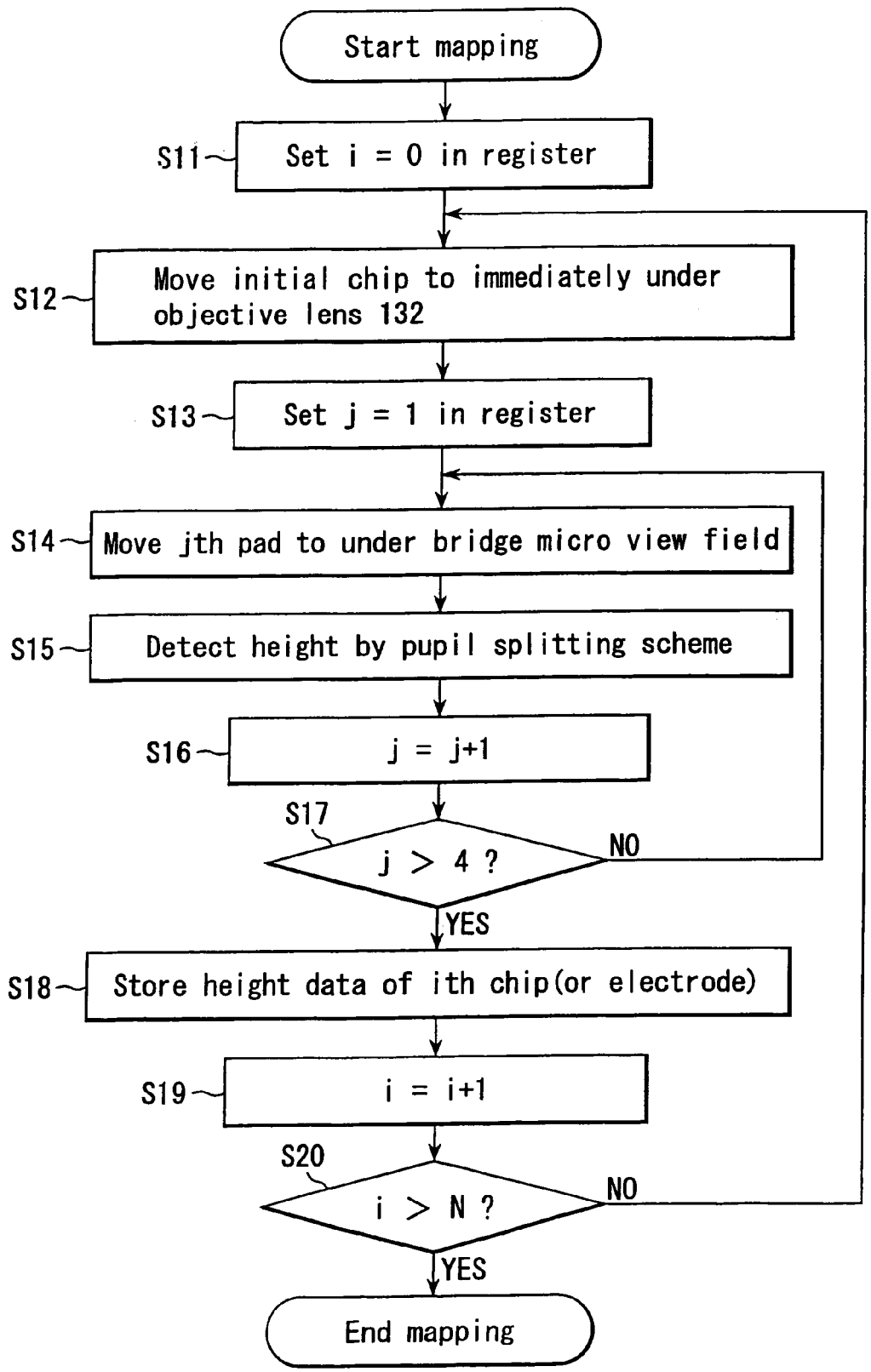
FIG. 8 is a flow chart showing the procedure of auto focus by pupil splitting of FIG. 7.
Figure 9A:
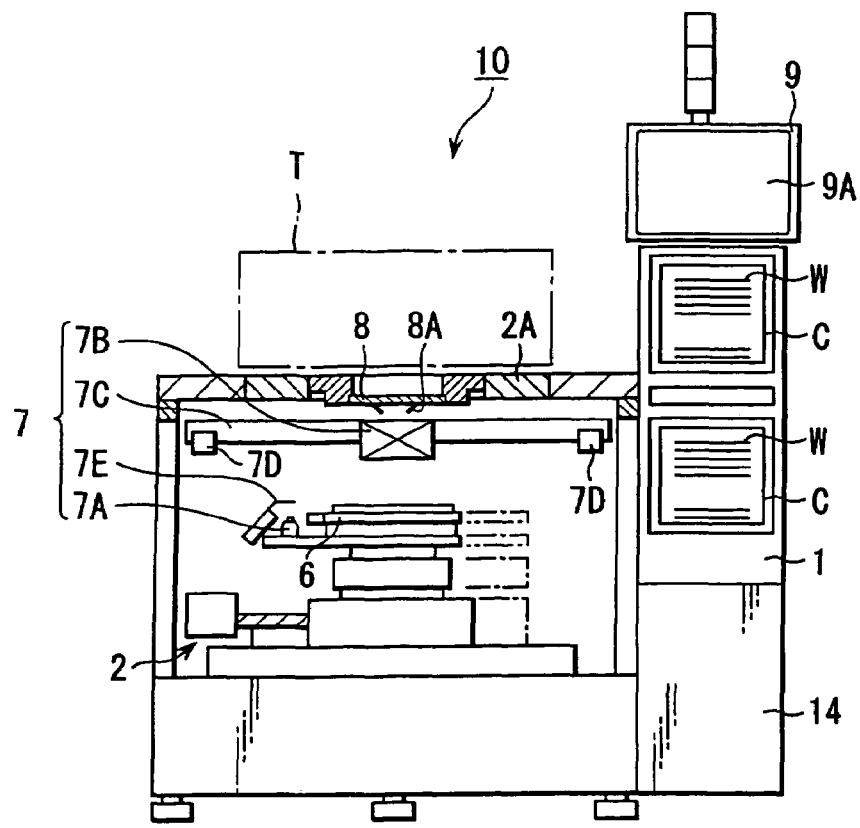
Figure 9B:
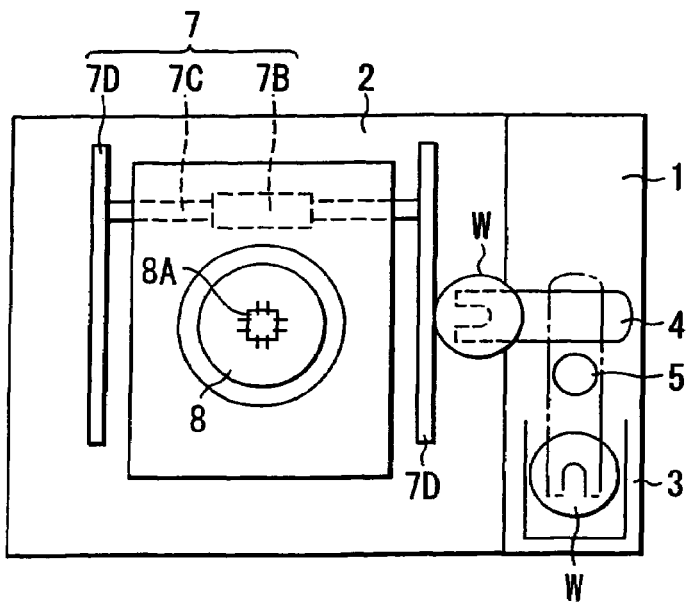

In FIG. 8, a chip number i in the register of the control unit 14 is set to 0 (step S11). The main chuck 11 is moved so that the initial chip is positioned immediately under the objective lens 132 (step S12). A number j of an electrode pad P in the register of the control unit 14 is set to 1 (step S13). When a predetermined electrode pad P is moved to immediately below the objective lens 132, the electrode pad P (J) is positioned within the visual field of the second image sensing mechanism 13, as shown in FIG. 4 (step S14). The surface height of the electrode pad P (J) is obtained by using the focal point detection unit 16 having pupil splitting (step S15).

Detection of the surface height by pupil splitting in step S15 can be performed with the following procedure. Observation light is irradiated by the light source 131A of the second image sensing mechanism 13. The irradiation light is focused by the condenser lens 131B, passes through the first and second apertures 131E and 131F of the second visual field limiting member 131C, then through the relay lens 131D, turns its optical path by the first half mirror 133, passes through the objective lens 132, and irradiates the wafer W. The irradiated region corresponds to the electrode pad P of the chip formed on the wafer W, as shown in FIG. 3, because it is limited by the first and second apertures 131E and 131F. The reflected light of this irradiation passes through the objective lens 132, half mirror 133, and relay lens 134, and turns its optical path through the half mirror 135. The reflected lights corresponding to the second apertures 131F are blocked by the first visual field limiting member 136. As a result, only the reflected light corresponding to the first aperture 131E passes through the relay lenses 137 and 138 and is detected by the CCD 139. At this stage, the surface of the electrode pad P does not always coincide with the focal point of the second image sensing mechanism 13.

Part of the light reflected by the wafer W is transmitted through the half mirror 135 and becomes incident on the focal point detection unit 16. This incident light is limited by the second visual field limiting member 161, and only beams that have been transmitted through the two apertures 161A are split into two beams with the pupil splitting mirror 163. The two split light beams pass through the relay lenses 164 and 165 and are detected by the photosensor 166. The photosensor 166 detects the two pairs of light quantity distributions 501 (see FIGS. 5 and 6) corresponding to the two apertures 161A. At this stage, when the surface of the electrode pad P of the wafer W is behind the focal point of the second image sensing mechanism 13, the distance between the light quantity distributions of each pair is larger than that when the electrode pad P is at the in-focus position. The photosensor 166 photoelectrically converts the received light, and outputs the converted signal to the arithmetic operator 168 through the A/D converter 167. The arithmetic operator 168 calculates the average value of the distances A and B (see FIG. 6) between the two pairs of light quantity distributions on the basis of this signal. The defocus amount of the surface of the electrode pad P is obtained on the basis of this average value. The arithmetic operator 168 outputs the arithmetic operation result to the control unit 14. The control unit 14 drives the driving unit 17 such that the main chuck 11 is moved, the defocus amount is corrected, and the surface of the electrode pad P is leveled at the focal point of the second image sensing mechanism 13. As a result, auto focus of the electrode pad P is ended, and the Z position of the main chuck 11 (i.e., the surface height of the electrode pad P) is detected. In this manner, the focal point detection unit 16 can obtain both the defocus direction and defocus amount concerning the surface height of the electrode pad P simultaneously. To focus the wafer W, conventionally, the main chuck 11 is excessively moved vertically. In this embodiment, the main chuck 11 can be auto-focused with the surface of the main chuck 11 by one upward operation of the electrode pad P, and a time required for focusing can be shortened.

When the focal point detection unit 16 ends auto focus for the electrode pad P in the above manner, the value of the register j is incremented (step S16). Whether the number of electrode pads P that are auto-focused reaches a predetermined number (e.g., 4) is checked (step S17). If the auto-focused number is less than the predetermined number, steps S14, S15, and S16 are performed again. In step S17, if the auto-focused number reaches the predetermined number, the surface heights of the predetermined number of electrode pads P are stored in the storage (step S18). The value of the register i is incremented (step S19). Whether the surface heights of the electrode pads P of all the chips N are detected is checked (step S20). If any chip remains undetected, the operation of steps S12 to step S18 is repeated. When the surface heights of all chips are mapped, the mapping operation of the wafer W is ended. The above steps S11 to S20 can be performed by appropriately changing their order.

As has been described above, according to this embodiment, in probe test of the wafer W, auto focus by means of pupil splitting is utilized to detect the surface heights of the plurality of chips formed on the wafer W. As a result, the surface heights of the electrode pad P are detected by only moving the main chuck 11 downward or upward by an amount corresponding to the defocus amount. Thus, the auto focus time is remarkably shortened when compared to the prior art, and the test throughput is increased.

Since the surface heights of all the chips formed on the wafer W are detected, the main chuck 11 can be operated on the basis of the steps of each chip, and a stable needle pressure can be obtained for each chip, so that a highly reliable test can be performed.

In the above embodiment, the surface heights are detected for all the chips on the wafer W. Alternatively, the surface heights of a predetermined number of chips may be detected where necessary. The test target object is not limited to a wafer.

The embodiment of the present invention can provide a probing method and prober with which the surface height of the individual electronic circuit device formed on a test target object is detected quickly, so that the throughput is increased and a highly reliable test is performed with a stable needle pressure.

The steps in the probing method of the present invention can be performed by appropriately changing their order.

What is claimed is:

1. A method of measuring electrical characteristics of a plurality of electronic circuit devices formed on a test target object by using a prober, the method comprising:

(a) detecting a position of at least one probe among a plurality of probes provided to a probe card, the detecting of the position of the probe being performed by a load sensor;

(b) detecting a position of an electrode surface of each of the electrical circuit devices formed on a surface of the test target object placed on a stage; and (c) bringing the plurality of probes and a predetermined electrode of one of the electrical circuit devices into contact with each other on the basis of the detected position of the probe and positions of the surfaces of the electrodes, wherein the position of the electrode surface of each of the electrical circuit devices detected in the (b) is an average position of the surfaces of said plurality of electrodes of each of the electrical circuit devices.

2. A method according to claim 1, wherein the (b) of detecting the average position of the surfaces of said plurality of electrodes is performed by using a pupil sensor which pupil-splits reflected light from the surfaces of the electrodes and detects defocus amounts of the surfaces of the electrodes on the basis of split light quantity distributions.

3. A method according to claim 2, wherein the (b) of detecting the average position of the surfaces of said plurality of electrodes is performed for three electrodes per electrical circuit device.

4. A method of measuring electrical characteristics of a plurality of electronic circuit devices formed on a test target object by using a prober, the method comprising:
   (a) detecting a position of at least one probe among a plurality of probes provided to a probe card, the detecting of the position of the probe being performed by a pupil sensor;
   (b) detecting a position of an electrode surface of each of the electrical circuit devices formed on a surface of the test target object placed on a stage; and
   (c) bringing the plurality of probes and a predetermined electrode of one of the electrical circuit devices into contact with each other on the basis of the detected position of the probe and positions of the surfaces of the electrodes, wherein
   the position of the electrode surface of each of the electrical circuit devices detected in the (b) is an average position of the surfaces of said plurality of electrodes of each of the electrical circuit devices,
   the (b) of detecting the average position of the surfaces of said plurality of electrodes is performed by using a pupil sensor which pupil-splits reflected light from the surfaces of the electrodes and detects defocus amounts of the surfaces of the electrodes on the basis of split light quantity distributions, and
   the (b) of detecting performed by using the pupil sensor comprises:
   (a1) irradiating light onto a predetermined region of a surface of one electrode of at least one electrical circuit device on the test target object placed on the stage;
   (a2) pupil-splitting reflected light reflected by the predetermined region into first and second light;
   (a3) obtaining light quantity distributions of the first and second light, respectively, with a photosensor;
   (a4) obtaining a defocus amount of the surface of one electrode on the basis of the light quantity distributions of the first and second light; and
   (a5) repeating the above (a1)-(a4), thereby detecting an average defocus amount of the surfaces of said plurality of electrodes of each of the electrical circuit devices formed on a surface of the test target object.

5. A method of measuring electrical characteristics of a plurality of electronic circuit devices formed on a test target object by using a prober, the method comprising:
   (a) detecting a position of at least one probe among a plurality of probes provided to a probe card;
   (b) detecting a position of an electrode surface of each of the electrical circuit devices formed on a surface of the test target object placed on a stage, the detected position of the electrode surface of each of the electrical circuit devices being an average position of the surfaces of said plurality of electrodes of each of the electrical circuit devices; and
   (c) bringing the plurality of probes and a predetermined electrode of one of the electrical circuit devices into contact with each other on the basis of the detected position of the probe and the positions of the surfaces of the electrodes.

6. A method according to claim 5, wherein the (b) of detecting the average position of the surfaces of said plurality of electrodes is performed by using a pupil sensor which pupil-splits reflected light from the surfaces of the electrodes and detects defocus amounts of the surfaces of the electrodes on the basis of split light quantity distributions.

7. A method according to claim 6, wherein the (b) of detecting the average position of the surfaces of said plurality of electrodes is performed for three electrodes per electrical circuit device.

8. A method according to claim 6, wherein the (b) of detecting performed by using the pupil sensor comprises:
   (a1) irradiating light onto a predetermined region of a surface of one electrode of at least one electrical circuit device on the test target object placed on the stage;
   (a2) pupil-splitting reflected light reflected by the predetermined region into first and second light;
   (a3) obtaining light quantity distributions of the first and second light, respectively, with a photosensor;
   (a4) obtaining a defocus amount of the surface of one electrode on the basis of the light quantity distributions of the first and second light; and
   (a5) repeating the above steps, thereby detecting an average defocus amount of the surfaces of said plurality of electrodes of each of the electrical circuit devices formed on a surface of the test target object.

9. A method according to claim 5, wherein the (a) of detecting the position of the probe comprises performing detection by using a load sensor.

10. A method according to claim 9, wherein the load sensor is fixed to the stage.

11. A method of measuring electrical characteristics of a plurality of electronic circuit devices formed on a test target object by using a prober, the method comprising:
    (a) detecting a position of at least one probe among a plurality of probes provided to a probe card;
    (b) detecting a position of an electrode surface of each of the electrical circuit devices formed on a surface of the test target object placed on a stage, the detection of the position of the surface of the electrode being performed by using a pupil sensor which pupil-splits reflected light from the surfaces of the electrodes and detects defocus amounts of the surfaces of the electrodes on the basis of split light quantity distributions; and
    (c) bringing the plurality of probes and a predetermined electrode of one of the electrical circuit devices into contact with each other on the basis of the detected position of the probe and the positions of the surfaces of the electrodes.

12. A method according to claim 11, wherein the position of the electrode surface of each of the electrical circuit devices detected in the (b) is an average position of the surfaces of said plurality of electrodes of each of the electrical circuit devices.

13. A method according to claim 12, wherein the (b) of detecting the average position of the surfaces of said plurality of electrodes is performed for three electrodes per electrical circuit device.

14. A method according to claim 11, wherein the (a) of detecting the position of the probe comprises performing detection by using a load sensor.

15. A method according to claim 14, wherein the load sensor is fixed to the stage.

16. A method according to claim 11, wherein the (a) of detecting performed by using the pupil sensor comprises:
    (a1) irradiating light onto a predetermined region of a surface of one electrode of at least one electrical circuit device on the test target object placed on the stage;

(a2) pupil-splitting reflected light reflected by the predetermined region into first and second light;
(a3) obtaining light quantity distributions of the first and second light, respectively, with a photosensor;
(a4) obtaining a defocus amount of the surface of one electrode on the basis of the light quantity distributions of the first and second light; and
(a5) repeating the above (a1)-(a4), thereby detecting an average defocus amount of the surfaces of said plurality of electrodes of each of the electrical circuit devices formed on a surface of the test target object.

* * * * *